US009953950B2

(12) United States Patent
Edelstein et al.

(10) Patent No.: US 9,953,950 B2
(45) Date of Patent: *Apr. 24, 2018

(54) NITRIDE-ENRICHED OXIDE-TO-OXIDE 3D WAFER BONDING

(71) Applicant: International Business Machines Corporation, Armonk, NY (US)

(72) Inventors: Daniel C. Edelstein, White Plains, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/264,492

(22) Filed: Sep. 13, 2016

(65) Prior Publication Data

US 2017/0170142 A1 Jun. 15, 2017

Related U.S. Application Data

(63) Continuation of application No. 14/967,137, filed on Dec. 11, 2015, now Pat. No. 9,496,239.

(51) Int. Cl.
H01L 23/00 (2006.01)
H01L 25/065 (2006.01)

(52) U.S. Cl.
CPC .......... *H01L 24/83* (2013.01); *H01L 25/0657* (2013.01); *H01L 2224/8302* (2013.01);
(Continued)

(58) Field of Classification Search
CPC ................ H01L 24/32; H01L 21/0217; H01L 21/02247; H01L 23/528; H01L 24/27;
(Continued)

(56) References Cited

U.S. PATENT DOCUMENTS 6,291,343 B1 9/2001 Tseng et al.
6,864,155 B2 3/2005 Wang
(Continued)

FOREIGN PATENT DOCUMENTS

EP 1275142 A1 5/2007

OTHER PUBLICATIONS

Tan, C.S. et al., "Low Temperature Wafer Bonding of Low-k Carbon-Doped Oxide for Application in 3D Integration", Electrochemical and Solid-State Letters, Nov. 23, 2009, pp. H27-H29, The Electrochemical Society, United States.
(Continued)

*Primary Examiner* — Roy Potter
(74) *Attorney, Agent, or Firm* — Sherman IP LLP; Kenneth L. Sherman; Steven Laut

(57) ABSTRACT

A semiconductor structure comprising a first semiconductor structure; a second semiconductor structure; and a silicon-nitride layer configured to bond the first semiconductor structure and second semiconductor structure together. The first semiconductor structure comprises a first wafer; a first dielectric layer; a first interconnect structure; and a first oxide layer. The second semiconductor structure comprises a second wafer; a second dielectric layer; a second interconnect structure; and a second oxide layer. The structure further comprises a first nitride layer residing on a top surface of the first oxide layer formed by a nitridation process of the top surface of the first oxide layer; and a second nitride layer residing on a top surface of the second oxide layer formed by the nitridation process of the top surface of the second oxide layer. Further, the silicon-nitride layer comprises the first nitride layer and the second nitride layer.

19 Claims, 4 Drawing Sheets

(52) U.S. Cl.
CPC ............... *H01L 2224/83896* (2013.01); *H01L 2225/06524* (2013.01); *H01L 2924/05042* (2013.01)

(58) Field of Classification Search
CPC ..... H01L 24/29; H01L 24/83; H01L 25/0657; H01L 21/02252; H01L 21/02255; H01L 2224/27848; H01L 2224/29187; H01L 2224/32145; H01L 2224/83896; H01L 24/05042; H01L 2225/96524; H01L 2224/8302

See application file for complete search history.

(56) References Cited

U.S. PATENT DOCUMENTS

| | | |
|---|---|---|
| 6,984,570 B2 | 1/2006 | Wang |
| 7,602,070 B2 | 10/2009 | Tong et al. |
| 7,611,974 B2 | 11/2009 | Letertre |
| 7,645,701 B2 | 1/2010 | Anderson |
| 7,750,488 B2 | 7/2010 | Patti et al. |
| 7,863,650 B2 | 1/2011 | Letertre |
| 8,097,523 B2 | 1/2012 | Kobayashi et al. |
| 8,318,586 B2 * | 11/2012 | Libralesso .......... H01L 21/2007 257/E21.24 |
| 9,165,974 B2 | 10/2015 | Kim et al. |
| 9,496,239 B1 * | 11/2016 | Edelstein ................ H01L 24/32 |
| 2010/0006857 A1 | 1/2010 | Letertre |

OTHER PUBLICATIONS

Ventosa, C. et al. "Mechanism of Thermal Silicon Oxide Direct Wafer Bonding", Electrochemical and Solid-State Letters, Aug. 4, 2009, pp. H373-H375, The Electrochemical Society, United States.

Eichler, M. et al., "Effects on Silanol Condensation during Low Temperature Silicon Fusion Bonding", Journal of the Electrochemical Society, Aug. 20, 2009, pp. H786-H793, The Electrochemical Society, United States.

Warner, K. et al., "Low-Temperature Oxide-Bonded Three-Dimensional Integrated Circuits", Proceedings in of the 2002 IEEE International SOI Conference, Oct. 7-10, 2002, pp. 123-125, IEEE, United States.

Schjolberg-Henriksen, K. et al., "Oxide charges induced by plasma activation for wafer bonding", Sensors and Actuators, Sep. 9, 2002, pp. 99-105, vol. 102, Issue 1-2, Elsevier Science B.V., United States.

U.S. Non-Final Office Action for Application U.S. Appl. No. 14/967,137, dated Apr. 25, 2016.

U.S. Notice of Allowance for Application U.S. Appl. No. 14/967,137, dated Jul. 21, 2016.

List of IBM Patents or Applications Treated as Related.

* cited by examiner

NITRIDE-ENRICHED OXIDE-TO-OXIDE 3D WAFER BONDING

BACKGROUND

Embodiments of the invention relate to semiconductor structures, in particular, for forming nitride-enriched oxide-to-oxide 3-dimensional semiconductor wafer bonding, and a method of manufacturing the same.

3D integration of semiconductor structures is critical in the current and future technology development. Accordingly, wafer-to-wafer bonding and oxide-to-oxide bonding development is one of the key elements to enable further technology development. The conventional process results in a weak and/or low oxide-to-oxide bonding energy. Enhancing the wafer-to-wafer (oxide-to-oxide) bonding strength is a great challenge in the current industry.

SUMMARY

Embodiments of the invention relate to semiconductor structures, in particular, forming nitride-enriched oxide-to-oxide 3-dimensional semiconductor wafer bonding, and a method of manufacturing the same. In one embodiment, the semiconductor structure comprises a first semiconductor structure; a second semiconductor structure; and a silicon-nitride layer configured to bond the first semiconductor structure and second semiconductor structure together. The first semiconductor structure comprises a first wafer; a first dielectric layer; a first interconnect structure; and a first oxide layer. The second semiconductor structure comprises a second wafer; a second dielectric layer; a second interconnect structure; and a second oxide layer. The structure further comprises a first nitride layer residing on a top surface of the first oxide layer formed by a nitridation process of the top surface of the first oxide layer; and a second nitride layer residing on a top surface of the second oxide layer formed by the nitridation process of the top surface of the second oxide layer. Further, the silicon-nitride layer comprises the first nitride layer and the second nitride layer.

In one embodiment of the present invention, a method of forming a nitride-enriched oxide-to-oxide 3-dimensional semiconductor wafer bonding comprises forming a first semiconductor structure; forming a second semiconductor structure; and forming a silicon-nitride layer configured to bond the first semiconductor structure and second semiconductor structure together.

Forming the first semiconductor structure comprises: selectively forming a first dielectric layer on a surface of a first wafer; forming a first interconnect structure within the first dielectric layer; and forming a first oxide layer on a surface of the first dielectric layer. Forming the second semiconductor structure comprises: selectively forming a second dielectric layer on a surface of a second wafer; forming a second interconnect structure within the second dielectric layer; and forming a second oxide layer on a surface of the second dielectric layer.

Forming the silicon-nitride layer comprises: forming a first nitride layer residing on a top surface of the first oxide layer, wherein the first nitride layer is formed by a nitridation process of the top surface of the first oxide layer; forming a second nitride layer residing on a top surface of the second oxide layer, wherein the second nitride layer is formed by the nitridation process of the top surface of the second oxide layer; and bonding the first nitride layer and second nitride layer together; wherein the silicon-nitride layer has a thickness between 3-7 angstroms.

These and other features, aspects and advantages of the present invention will become understood with reference to the following description, appended claims and accompanying figures.

DETAILED DESCRIPTION

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

As used herein, a "lengthwise" element is an element that extends along a corresponding lengthwise direction, and a "widthwise" element is an element that extends along a corresponding widthwise direction.

Figure 1:
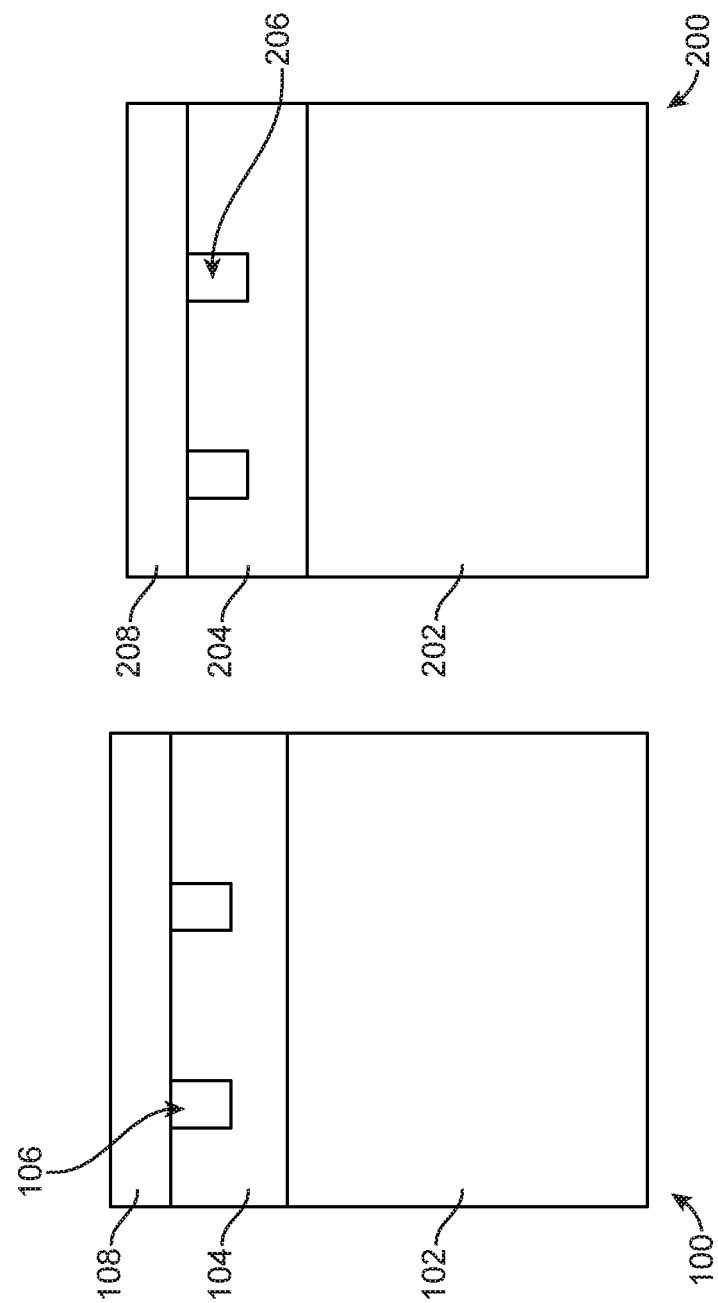
FIG. 1 is a cross-sectional view of a first semiconductor structure and second semiconductor structure, according to one embodiment.

FIG. 1 is a cross-sectional view of a first semiconductor structure 100 and second semiconductor structure 200, according to one embodiment of the present invention. In one embodiment, the first semiconductor structure 100 comprises: a first wafer 102; a first dielectric layer 104; a first interconnect structure 106; and a first oxide layer 108. In another embodiment, the first dielectric layer 104 resides on a surface of the first wafer 102; the first interconnect structure 106 is within the first dielectric layer 104; and the first oxide layer 108 resides on a surface of the first dielectric layer 104.

In another embodiment of the present invention, the second semiconductor structure 200 comprises: a second wafer 202; a second dielectric layer 204; a second interconnect structure 206; and a second oxide layer 208. In another embodiment, the second dielectric layer 204 resides on a surface of the second wafer 202; the second interconnect structure 206 is within the second dielectric layer 204; and the second oxide layer 208 resides on a surface of the second dielectric layer 204.

Figure 2:
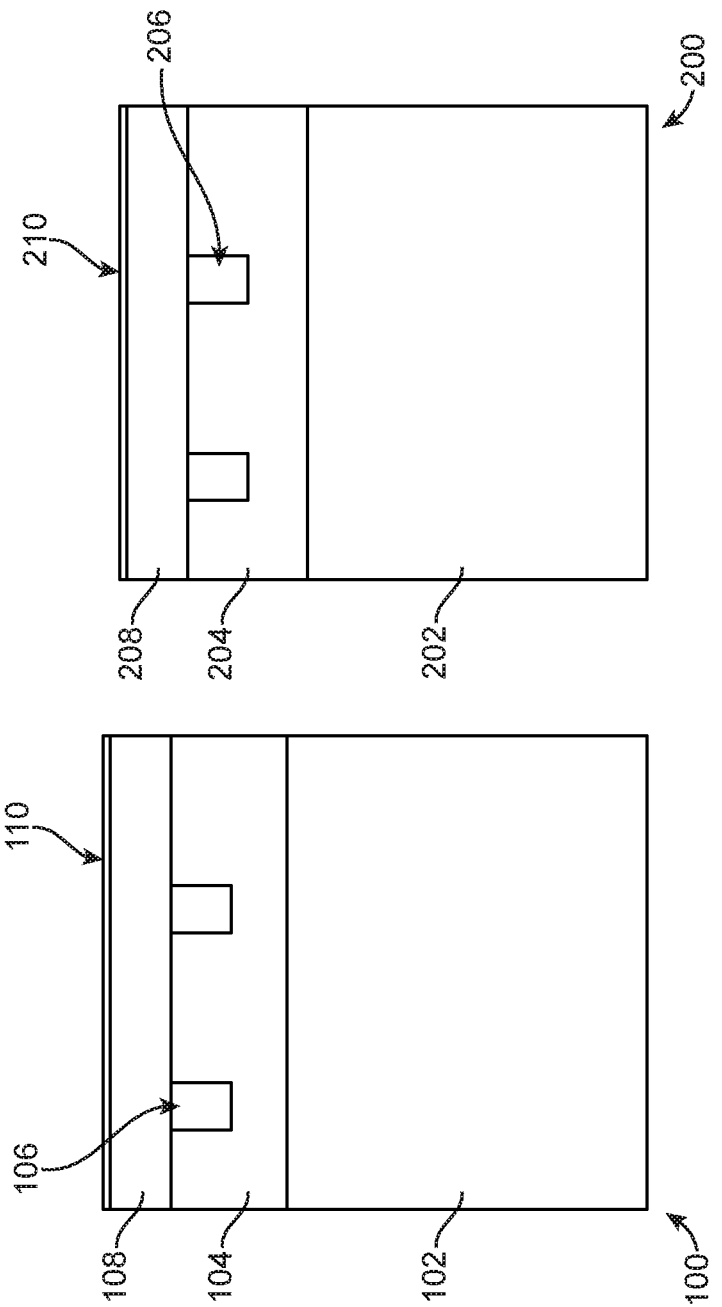
FIG. 2 is a cross-sectional view of a result of the exemplary first semiconductor structure and second semiconductor structure of FIG. 1 after forming a first nitride layer on a first oxide layer and a second nitride layer on a second oxide layer, according to an embodiment.

FIG. 2 is a cross-sectional view of a result of the exemplary first semiconductor structure 100 and second semiconductor 200 structure of FIG. 1 after forming a first nitride layer 110 on a first oxide layer 108 and a second nitride layer 210 on a second oxide layer 208, according to an embodiment of the present invention. In this embodiment, the first nitride layer 110 residing on a top surface of the first oxide layer 108 is formed by a nitridation process of the top surface of the first oxide layer 108. Similarly, the second nitride layer 210 residing on a top surface of the second oxide layer 208 is formed by the nitridation process of the top surface of the second oxide layer 208.

In one embodiment, the nitridation process uses either nitrogen or ammonia as a reactant. In one embodiment of the present invention, the nitridation process is a thermal nitridation process between 100-500 degrees Celsius. In another embodiment, the nitridation process is plasma ion nitridation process.

Figure 3:
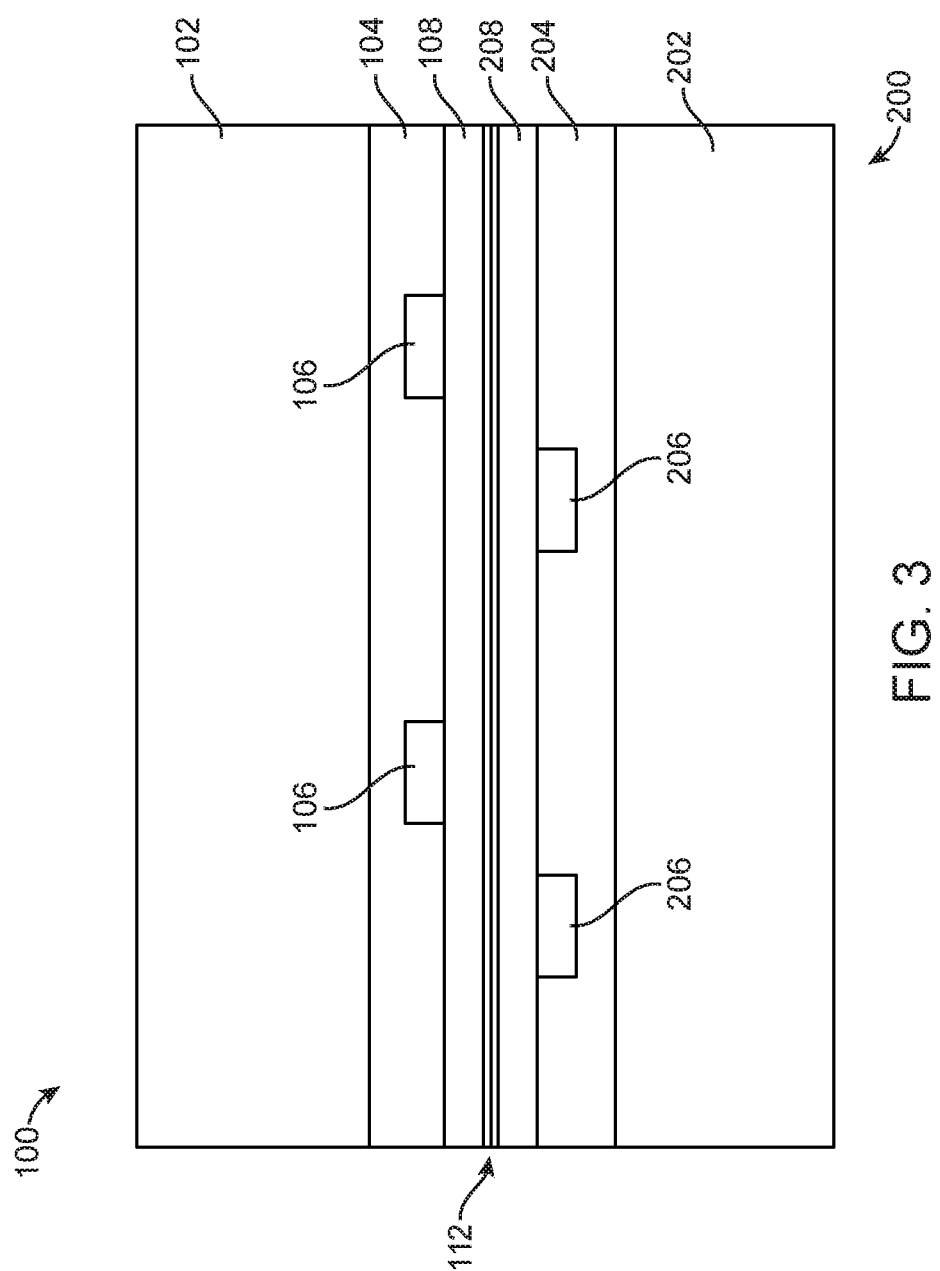
FIG. 3 is a cross-sectional view of a result of the exemplary first semiconductor structure and second semiconductor structure of FIG. 2 after forming a silicon-nitride layer to bond the first semiconductor structure and second semiconductor structure together, according to an embodiment.

FIG. 3 is a cross-sectional view of a result of the exemplary first semiconductor structure 100 and second semiconductor structure 200 of FIG. 2 after forming a silicon-nitride layer 112 to bond the first semiconductor structure 100 and second semiconductor structure 200 together, according to an embodiment of the present invention. In another embodiment of the present invention, the silicon-nitride layer 112 comprises the first nitride layer 110 and the second nitride layer 210. Moreover, in one embodiment, the silicon-nitride layer 112 has a thickness between 3-7 angstroms.

Figure 4:
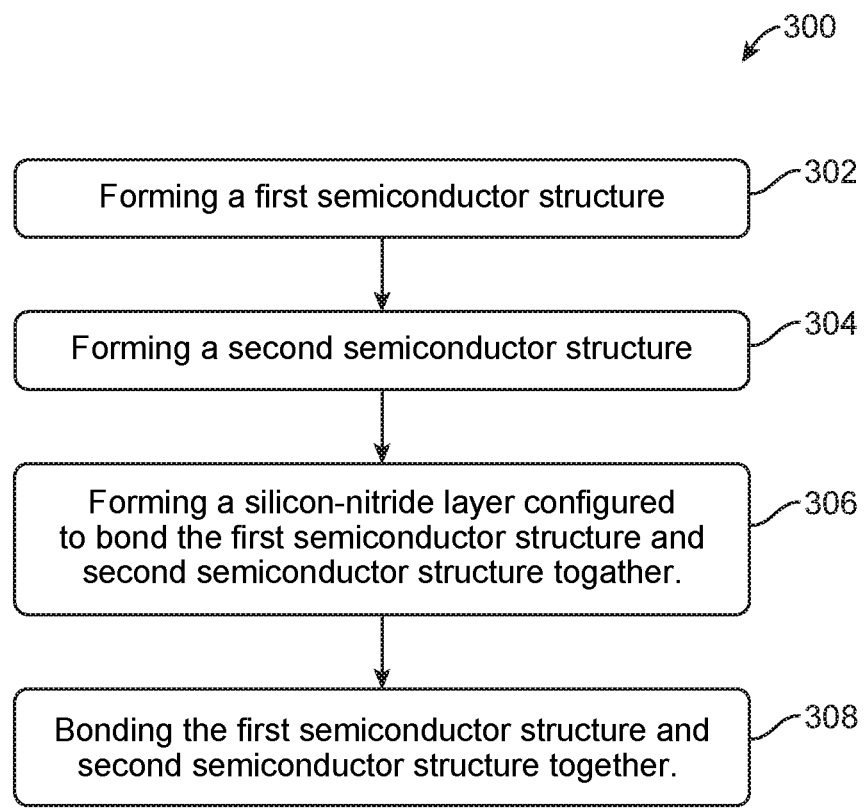
FIG. 4 illustrates a block diagram for a process for forming nitride-enriched oxide-to-oxide 3-dimensional semiconductor wafer bonding, according to one embodiment.

FIG. 4 illustrates a block diagram for a process 300 for forming nitride-enriched oxide-to-oxide 3-dimensional semiconductor wafer bonding, according to one embodiment of the present invention. In one embodiment, the method 300 begins at block 302, forming a first semiconductor structure 100 (FIG. 2). In another embodiment, forming the first semiconductor structure 100 comprises: selectively forming a first dielectric layer 104 on a surface of a first wafer 102; forming a first interconnect structure 106 within the first dielectric layer 104; and forming a first oxide layer 108 on a surface of the first dielectric layer 108 (FIG. 2).

In another embodiment, process 300 continues to block 304, forming a second semiconductor structure 200 (FIG. 2). In one embodiment of the present invention, forming the second semiconductor structure 200 comprises: selectively forming a second dielectric 204 layer on a surface of a second wafer 202; forming a second interconnect structure 206; and forming a second oxide layer 208 on a surface of the first dielectric layer 204 (FIG. 2).

In another embodiment of the present invention, after forming the second semiconductor structure in block 304, process 300 continues with block 306, forming a silicon-nitride layer 112 configured to bond the first semiconductor structure 100 and second semiconductor structure together 200 (FIG. 3). In one embodiment, forming the silicon-nitride layer 112 comprises: forming a first nitride layer 110 residing on a top surface of the first oxide layer 108, and forming a second nitride layer 210 residing on a top surface of the second oxide layer 208. In this embodiment, the first nitride layer 110 is formed by a nitridation process of the top surface of the first oxide layer 108. Further, the second nitride layer 210 is formed by the nitridation process of the top surface of the second oxide layer 208 (FIG. 2).

In one embodiment of the present invention, the silicon-nitride layer 210 (FIG. 3) has a thickness between 3-7 angstroms. In one embodiment, block 306, forming the silicon-nitride layer 112 uses either nitrogen or ammonia as a reactant. In another embodiment of the present invention, block 306, forming the silicon-nitride layer 112 utilizes is a thermal nitridation process between 100-500 degrees Celsius. In another embodiment, process 306 utilizes is plasma ion nitridation process.

In one embodiment, process 300 continues to block 308, bonding the first semiconductor structure 100 and second semiconductor structure 200 together (See FIG. 3). In this embodiment, the second semiconductor structure 200 is inverted so the second nitride layer 210 residing on the top surface of the second oxide layer 208 contacts the first nitride layer 110 residing on the top surface of the first oxide layer 108, thereby forming the silicon-nitride layer 210. It is understood that in the present embodiment, the first semiconductor structure 100 may be inverted so that the first nitride layer 110 contacts the second nitride layer 210.

The exemplary methods and techniques described herein may be used in the fabrication of IC chips. In one embodiment, the IC chips may be distributed by a fabricator in raw wafer form (i.e., as a single wafer that has multiple unpackaged IC chips), as a bare die, or in a packaged form. In the latter case, the IC chip is mounted in a single IC chip package (e.g., a plastic carrier with leads that are affixed to a motherboard or other higher level carrier) or in a multiIC chip package (e.g., a ceramic carrier that has either or both surface interconnections or buried interconnections). The IC chip is then integrated with other IC chips, discrete circuit elements and/or other signal processing devices as part of either (a) an intermediate product, such as a motherboard, or (b) an end product, such as microprocessors, smart phones, mobile phones, cellular handsets, set-top boxes, DVD recorders and players, automotive navigation, printers and peripherals, networking and telecom equipment, gaming systems, toys and digital cameras, as non-limiting examples. One or more embodiments, may be applied in any of various highly integrated semiconductor devices.

Unless described otherwise or in addition to that described herein, "depositing" may include any now known or later developed techniques appropriate for the material to be deposited, including, but not limited to: CVD, LPCVD, PECVD, semi-atmosphere CVD (SACVD), high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, PVD, ALD, chemical oxidation, MBE, plating or evaporation. Any references to "poly" or "poly silicon" should be understood to refer to polycrystalline silicon.

References herein to terms such as "vertical", "horizontal," etc. are made by way of example, and not by way of limitation, to establish a frame of reference. The term "horizontal" as used herein is defined as a plane parallel to the conventional plane or surface of the substrate, regardless of the actual spatial orientation of the semiconductor substrate. The term "vertical" refers to a direction perpendicular to the horizontal, as just defined. Terms, such as "on," "above," "below," "side" (as in "sidewall"), "higher," "lower," "over," "beneath" and "under," are defined with respect to the horizontal plane. It is understood that various other frames of reference may be employed for describing one or more embodiments without departing from the spirit and scope of the one or more embodiments.

References in the claims to an element in the singular is not intended to mean "one and only" unless explicitly so stated, but rather "one or more." All structural and functional equivalents to the elements of the above-described exemplary embodiment that are currently known or later come to be known to those of ordinary skill in the art are intended to be encompassed by the present claims. No claim element herein is to be construed under the provisions of 35 U.S.C. section 112, sixth paragraph, unless the element is expressly recited using the phrase "means for" or "step for."

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, steps, operations, elements, materials, and/or components, but do not preclude the presence or addition of one or more other features, steps, operations, elements, materials, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A structure, comprising:
    a first semiconductor structure including a first dielectric layer and a first interconnect structure;
    a second semiconductor structure; and
    a silicon-nitride layer configured to bond the first semiconductor structure and second semiconductor structure together;
    wherein the first semiconductor structure comprises a first wafer and a first oxide layer.

2. The structure of claim 1, wherein:
    the first dielectric layer resides on a surface of the first wafer;
    the first interconnect structure is within the first dielectric layer; and
    the first oxide layer resides on a surface of the first dielectric layer.

3. The structure of claim 2, further comprising:
    a first nitride layer residing on a top surface of the first oxide layer, wherein the first nitride layer is formed by a nitridation process of the top surface of the first oxide layer.

4. The structure of claim 3, wherein the second semiconductor structure comprises:
    a second wafer;
    a second dielectric layer;
    a second interconnect structure; and
    a second oxide layer.

5. The structure of claim 4, wherein:
    the second dielectric layer resides on a surface of the second wafer;
    the second interconnect structure is within the second dielectric layer; and
    the second oxide layer resides on a surface of the second dielectric layer.

6. The structure of claim 5, further comprising:
    a second nitride layer residing on a top surface of the second oxide layer, wherein the second nitride layer is formed by the nitridation process of the top surface of the second oxide layer.

7. The structure of claim 6, wherein the nitridation process comprises a reactant selected from the group consisting of nitrogen and ammonia.

8. The structure of claim 7, wherein the nitridation process is a thermal nitridation process between 100-500 degrees Celsius.

9. The structure of claim 7, wherein the nitridation process is plasma ion nitridation process.

10. The structure of claim 6, wherein the silicon-nitride layer comprises the first nitride layer and the second nitride layer.

11. The structure of claim 6, wherein the silicon-nitride layer has a thickness between 3-7 angstroms.

12. A method, comprising:
    forming a first semiconductor structure comprising:
        selectively forming a first dielectric layer on a surface of a first wafer; and
        forming a first interconnect structure within the first dielectric layer;
    forming a second semiconductor structure;
    forming a silicon-nitride layer configured to bond the first semiconductor structure and the second semiconductor structure together; and
    bonding the first semiconductor structure and the second semiconductor structure together;
    wherein forming the silicon-nitride layer comprises:
        forming a first nitride layer residing on a top surface of a first oxide layer of the first semiconductor; and
        forming a second nitride layer residing on a top surface of a second oxide layer of the second semiconductor.

13. The method of claim 12, wherein forming the first semiconductor structure further comprises:
    forming the first oxide layer on a surface of the first dielectric layer.

14. The method of claim 13, wherein forming the second semiconductor structure comprises:
    selectively forming a second dielectric layer on a surface of a second wafer;
    forming a second interconnect structure within the second dielectric layer; and
    forming the second oxide layer on a surface of the second dielectric layer.

15. The method of claim 14, wherein:
    the first nitride layer and the second nitride layer is formed by a nitridation process of the top surface of the first oxide layer and the second oxide layer.

16. The method of claim 15, wherein the nitridation process comprises a reactant selected from the group consisting of nitrogen and ammonia.

17. The method of claim 16, wherein the nitridation process is a process selected from the group consisting of thermal nitridation and plasma nitridation.

18. A method, comprising:
    forming a first semiconductor structure, comprising:
        selectively forming a first dielectric layer on a surface of a first wafer;
        forming a first interconnect structure within the first dielectric layer; and
        forming a first oxide layer on a surface of the first dielectric layer;

forming a second semiconductor structure, comprising:
selectively forming a second dielectric layer on a surface of a second wafer;
forming a second interconnect structure; and
forming a second oxide layer on a surface of the first dielectric layer; and
bonding the first semiconductor structure and second semiconductor structure together.

19. The method of claim 18, wherein bonding further comprises:
nitridizing a top surface of the first oxide layer; and
nitridizing a top surface of the second oxide layer;
bonding the nitridized top surface of the first oxide layer to the nitridized top surface of the second oxide layer;
wherein the nitridized top surface of the first oxide layer and the nitridized top surface of the second oxide layer has a combined thickness between 3-7 angstroms.

* * * * *